United States Patent
Fatemi et al.

(10) Patent No.: US 12,166,491 B2
(45) Date of Patent: Dec. 10, 2024

(54) CLOCK AND DATA RECOVERY CIRCUIT FROM AN N-PULSE AMPLITUDE MODULATION SIGNAL

(71) Applicant: IHP GmbH-Innovations for High Performance Microelectronics/Leibniz-Instit. für innovative Mikroelektronik, Frankfurt (DE)

(72) Inventors: Adel Fatemi, Frankfurt (DE); Andrea Malignaggi, Frankfurt (DE)

(73) Assignee: IHP GMBH—INNOVATIONS FOR HIGH PERFORMANCE MICROELECTRONICS / LEIBNIZ-INSTITUT FÜR INNOVATIVE MIKROELEKTRONIK (DE)

( * ) Notice: Subject to any disclaimer, the term of this patent is extended or adjusted under 35 U.S.C. 154(b) by 44 days.

(21) Appl. No.: 18/064,588

(22) Filed: Dec. 12, 2022

(65) Prior Publication Data

US 2023/0188143 A1     Jun. 15, 2023

(30) Foreign Application Priority Data

Dec. 13, 2021   (EP) .................................... 21214163

(51) Int. Cl.
  *H03L 7/08*    (2006.01)
  *H03L 7/081*   (2006.01)
  *H03L 7/099*   (2006.01)

(52) U.S. Cl.
  CPC .......... *H03L 7/0807* (2013.01); *H03L 7/0814* (2013.01); *H03L 7/0991* (2013.01)

(58) Field of Classification Search
  CPC ... H03L 7/0807; H03L 7/0814; H03L 7/0991; H03L 7/08; H03L 7/085; H03L 7/087; H03L 7/091; H03L 7/095
  See application file for complete search history.

(56) References Cited

U.S. PATENT DOCUMENTS 5,425,060 A * 6/1995 Roberts ................... H04L 7/027
                                                       380/34
5,812,607 A * 9/1998 Hutchinson, IV ... H04B 7/2646
                                                       375/325

(Continued)

FOREIGN PATENT DOCUMENTS

EP          3440813          1/2021

OTHER PUBLICATIONS

Fatemi et al., "A 96-Gb/s PAM-4 Reciever Using Time-Interleaved Converters in 130-nm SiGe BiCMOS," IEEE Solid-State Circuits Letters, vol. 4, 2021, pp. 60-63.

(Continued)

*Primary Examiner* — James M Perez
(74) *Attorney, Agent, or Firm* — Sheridan Ross PC (57) ABSTRACT

An apparatus and a method for recovering clock and data from a multilevel pulse amplitude modulated signal received as input signal is suggested. The apparatus comprises a phase detector, a low-pass filter, a voltage-controlled oscillator, and a feedback loop forming a CDR loop. The voltage-controlled oscillator outputs a clock signal that is provided to the phase detector. The phase detector receives an MSB signal from a sampler. The apparatus also comprises an interleave circuit configured to receive the input signal and to generate two output signals having a smaller symbol rate than the input signal. The apparatus further comprises a logical gate configured to receive the output signals from the interleave circuit and to generate an enable signal for the phase detector indicating symmetrical transitions in the (Continued)

input signal. Lastly, the apparatus comprises a converter converting the output signals from the interleave circuit into an MSB and an LSB bit stream.

12 Claims, 8 Drawing Sheets

(56) References Cited

U.S. PATENT DOCUMENTS

| | | | | |
|---|---|---|---|---|
| 6,278,741 | B1* | 8/2001 | Danzer | H04L 27/38 |
| | | | | 375/222 |
| 6,549,587 | B1* | 4/2003 | Li | H04L 7/0278 |
| | | | | 375/326 |
| 7,505,541 | B1* | 3/2009 | Brunn | H03L 7/101 |
| | | | | 375/360 |
| 7,583,770 | B2* | 9/2009 | Troya | H04L 27/2675 |
| | | | | 375/233 |
| 8,115,543 | B2* | 2/2012 | Scheytt | H03F 3/19 |
| | | | | 330/10 |
| 9,143,371 | B1* | 9/2015 | Warner | H04L 25/03057 |
| 9,584,345 | B1* | 2/2017 | Baecher | H04L 7/0334 |
| 9,638,617 | B2* | 5/2017 | Birkholz | G01N 11/16 |
| 9,942,028 | B1* | 4/2018 | Dickson | H04L 25/03885 |
| 10,594,523 | B2* | 3/2020 | Bossard | H04L 25/4902 |
| 10,693,229 | B2* | 6/2020 | Grass | H04L 65/611 |
| 10,693,473 | B2* | 6/2020 | Tajalli | H03L 7/0995 |
| 10,819,349 | B2* | 10/2020 | Ng | H03L 7/087 |
| 10,931,286 | B1* | 2/2021 | Badizadegan | H03L 7/085 |
| 10,979,059 | B1* | 4/2021 | Shalmani | H03L 7/091 |
| 11,469,877 | B1* | 10/2022 | Raj | H04L 25/4917 |
| 11,757,613 | B2* | 9/2023 | Yue | H04L 7/0087 |
| | | | | 375/226 |
| 2003/0165208 | A1* | 9/2003 | Carter | H03L 7/0891 |
| | | | | 375/376 |
| 2004/0158420 | A1* | 8/2004 | Kim | H04L 7/0083 |
| | | | | 702/66 |
| 2006/0165187 | A1* | 7/2006 | Troya | H04L 27/2657 |
| | | | | 375/260 |
| 2006/0274861 | A1* | 12/2006 | Langenbach | H04L 25/03197 |
| | | | | 375/341 |
| 2008/0174343 | A1* | 7/2008 | Cha | H03K 5/2481 |
| | | | | 327/64 |
| 2009/0243681 | A1* | 10/2009 | Zerbe | H04L 7/0066 |
| | | | | 327/163 |
| 2012/0068748 | A1* | 3/2012 | Stojanovic | H03L 7/091 |
| | | | | 327/161 |
| 2012/0213510 | A1* | 8/2012 | Stojanovic | H04B 10/6165 |
| | | | | 398/25 |
| 2013/0083611 | A1* | 4/2013 | Ware | G06F 3/0625 |
| | | | | 365/191 |
| 2013/0227329 | A1* | 8/2013 | Leibowitz | G06F 1/12 |
| | | | | 713/400 |
| 2018/0241540 | A1* | 8/2018 | Shibasaki | H03L 7/0807 |
| 2019/0058576 | A1* | 2/2019 | Lim | H04L 7/0334 |
| 2020/0007363 | A1* | 1/2020 | Hossain | H04L 7/0058 |
| 2021/0067312 | A1* | 3/2021 | Kawasoe | H03L 7/091 |
| 2021/0266140 | A1* | 8/2021 | Stojanovic | H04L 7/0058 |
| 2022/0385444 | A1* | 12/2022 | Yue | H03L 7/0812 |
| 2023/0055351 | A1* | 2/2023 | Malignaggi | H01P 5/12 |
| 2023/0188143 | A1* | 6/2023 | Fatemi | H03L 7/0814 |
| | | | | 375/376 |

OTHER PUBLICATIONS

Musa et al., "Clock recovery in high-speed multilevel serial links," Proceedings of the 2003 International Symposium on Circuits and Systems, vol. 5, 2003, pp. V449-V452.

Stojanovic et al., "Timing Recovery in High-Speed PAM-4 Transmission Systems," 24th IEEE Telecommunications Forum, Nov. 22, 2016, 4 pages.

Extended European Search Report for Europe Patent Application No. 21214163.4, dated May 27, 2022, 9 pages.

* cited by examiner

CLOCK AND DATA RECOVERY CIRCUIT FROM AN N-PULSE AMPLITUDE MODULATION SIGNAL

CROSS-REFERENCE TO RELATED APPLICATIONS

This application claims the benefit of European Patent Application No. 21214163.4 filed Dec. 13, 2021, the entire contents of which are incorporated herein by reference in its entirety.

TECHNICAL FIELD

The present disclosure relates to an apparatus and a method for a clock and data recovery from an N-Pulse Amplitude Modulation (PAM-N) signal.

BACKGROUND

In wired data communications, the data, and not the clock, is transmitted through a medium, for instance an electrical conductor or an optic fibre. In general, the data are transmitted as digital data utilizing a predefined line code which defines how symbols are used to transmit information on the physical level. Certain level sequences, such as light intensities on optical fibers and voltages or currents on electrical lines, are assigned to binary bit sequences in the data stream. In the simplest case, also in terms of circuitry, the logical states 0 and 1 are assigned a logic level on the physical line. This is also referred to as Non-Return to Zero (NRZ), i.e. there is no state on the line that carries no information. The logical level on the physical line is a physical signal such as light intensity in an optical fibre or an electrical voltage or current in an electrical line.

During the transmission of the physical signal through the medium, the physical signal experiences dispersion and jitter. Therefore, the clock must be derived from the data on the receiver side to be retimed. The task of clock extraction and data retiming is called "clock and data recovery (CDR)". Known circuits work well for clock recovery for NRZ signals having two voltage levels. However, the performance of existing solutions degrades when the number N of modulation levels of a pulse amplitude modulation signal (PAM) increases to 4 and beyond, i.e. for PAM-N signals with N≥4.

WO 2017/182082 discloses a circuit for clock and data recovery of PAM signals that relies on converting the PAM signal into binary formats to determine a good reference for the clock recovery.

In view of the limitations of existing CDR circuits there remains a desire for a CDR circuit having an improved performance, especially for PAM-N signals with N≥4.

BRIEF SUMMARY

According to a first aspect the present disclosure suggests an apparatus for recovering clock and data from a multilevel pulse amplitude modulated signal received as an input signal by the apparatus. The input signal has a first symbol rate and transfers two bits per symbol. The apparatus comprises a phase detector, a low-pass filter, a voltage-controlled oscillator, and a feedback loop forming a CDR loop. The voltage-controlled oscillator outputs a clock signal that is provided as a first input signal to the phase detector. The apparatus comprises a sampler configured to extract an MSB signal from the input signal. The output of the sampler is connected with an input of the phase detector to provide the MSB signal as a second input to the phase detector. The apparatus also comprises an interleave circuit configured to receive the input signal and generates two output signals operating each at half-rate of the input signal. The apparatus further comprises a logical gate configured to receive the output signals from the interleave circuit and to generate an enable signal for the phase detector indicating symmetrical transitions in the input signal. Lastly, the apparatus comprises a converter converting the output signals from the interleave circuit into an MSB and an LSB bit stream.

Advantageously the proposed CDR circuit enables the faster transition detection between levels of the PAM signal and faster clock recovery avoiding error propagation through a system and improving the bit error rate (BER) of the system. Another advantage of the proposed CDR circuit is that its complexity does not increase with an increasing number of levels N of a PAM-N signal.

According to an advantageous embodiment the output signals of the interleave circuit are phase-shifted by 180°. As a result, two consecutive symbols of the input signal are present in the time domain simultaneously.

It has been found to be particularly useful if the two consecutive symbols of the input signal Din contained in the output signals of the interleave circuit are overlapping in the time domain during a predefined time window.

In a preferred embodiment the logical gate is an XNOR gate. The XNOR gate determines symmetrical transitions between different levels of the PAM signal without the need to evaluate the PAM signal on the bit level. As a result, symmetrical transitions are identified faster than by known CDR circuits. I in a useful embodiment the interleave circuit comprises two track and hold circuits. One of the them is triggered by rising edge of the clock, while the falling edge of the clock trigger the second track and hold circuit. In this approach, the track and hold circuits efficiently output two half-rate of the input signal, while they are 180 degree out of phase. In other words, the interleave circuit, transfers the input signal into two half rate output signals enabling the evaluation of symmetrical transitions between consecutive symbols in the input signal by the XNOR gate.

In a useful embodiment the interleave circuit is configured to receive the clock signal from the voltage-controlled oscillator. The clock signal synchronizes the interleave circuit with the remainder of the CDR circuit.

For the same reason it has been found useful that the converter is configured to receive the clock signal from the voltage-controlled oscillator. In this way the data contained in the input signal are outputted in a synchronized manner as to bit streams, namely an MSB and an LSB bit stream.

According to a second aspect of the present disclosure suggests a method for recovering clock and data signals from a multilevel pulse amplitude modulated signal transferring two bits per symbol at a first symbol rate. The method comprises receiving the multilevel pulse amplitude modulated signal as input signal;

extracting an MSB signal from the input signal;

providing the MSB signal to a phase detector included in a clock and data recovery loop;

generating from the input signals two output signals having a second symbol rate which is half of the first symbol rate of the input signal;

receiving the output signals at a logical gate generating an enable signal for the phase detector indicating symmetrical transitions in the input signal; and converting the output signals from the interleave circuit into an MSB and an LSB bit stream.

In an advantageous embodiment the method further comprises generating a clock signal and providing the clock signal to the phase detector included in the clock and data recovery loop.

Advantageously, the method comprises providing the clock signal to an interleave circuit generating the output signals having the second symbol rate and to a converter converting the output signals from the interleave circuit into an MSB and an LSB bit stream.

It has been found useful to phase shift the output signals by 180°.

The method according to the present disclosure enables the realizing corresponding advantages that have already been mentioned in connection with the apparatus for recovering clock and data from a multilevel pulse amplitude modulated signal. Additional advantages become apparent when reading the appended claims.

BRIEF DESCRIPTION OF THE DRAWINGS

Exemplary embodiments of the present disclosure are illustrated in the drawings and are explained in more detail in the following description. In the figures, the same or similar elements are referenced with the same or similar reference signs. It shows.

In the figures the same or similar components are labelled with the same or similar reference signs. The direction of signal transmission is indicated with arrows.

DETAILED DESCRIPTION

Figure 1A:
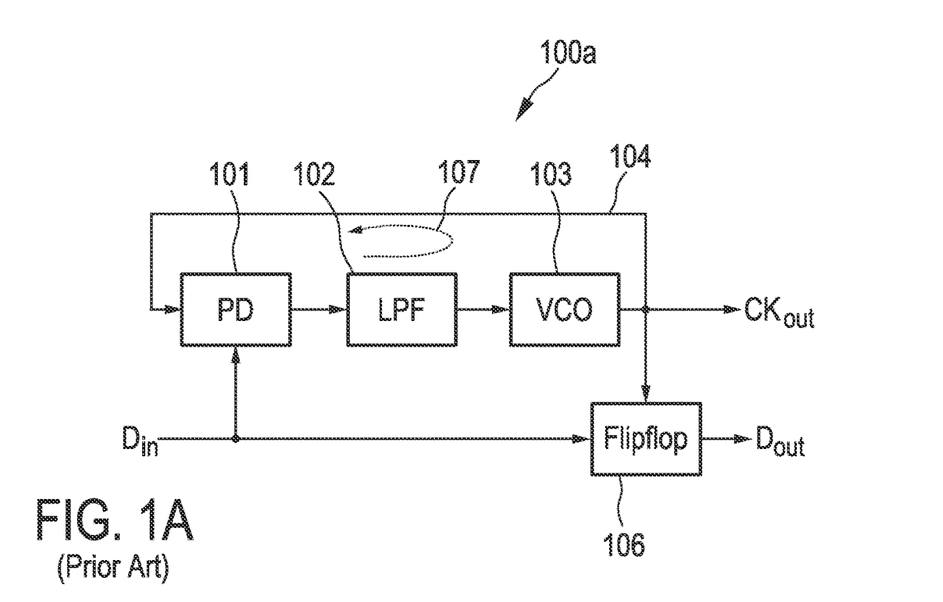
FIG. 1A a generic block diagram of a conventional CDR circuit.

FIG. 1A shows a generic block diagram of a CDR circuit 100a. The CDR circuit 100a includes a phase detector (PD) 101, which receives a data input signal Din as a first input. An output signal of the PD 101 is applied to a low-pass filter (LPF) 102, which suppresses high-frequency components in the output signal of the PD 101. The LPF 102 is connected with a voltage-controlled oscillator (VCO) 103, the oscillation frequency of which is tuned by an output signal of the LPF 102. An output signal CKout of the VCO 103 represents a clock signal and is transmitted via a feedback loop 104 as a second input signal to PD 101. The PD 101 generates an output signal proportional to the phase difference between input signals Din and CKout. The PD 101 drives the oscillation frequency of the VCO 103 such that phase and frequency of data input signal Din and clock signal CKout are the same. The ensemble of components 101-104 forms a CDR loop 107 within the CDR circuit 100a. The data input signal Din is also supplied to flip-flop 106 where it is stored. The flip-flop 106 is triggered with the clock signal CKout. As a result, the flip-flop outputs a data output signal Dout in synchronicity with the clock signal CKout.

The circuit diagram shown in FIG. 1A is a simplified because a perquisite enabling a CDR circuit to acquire the right phase and frequency of the clock signal CKout is an on-chip clock source oscillating close to the target data frequency which is the frequency of the clock signal CKout. A CDR circuit 100b taking this prerequisite into account is illustrated in FIG. 1B.

Compared with CDR circuit 100a, the CDR circuit 100b further comprises a crystal oscillator (XTAL) 108 providing a reference clock signal that is supplied to a phase frequency detector (PFD) 109. An output signal of the PFD 109 passes through a low-pass filter (LPF2) 111. An output signal of the LPF2 111 is transmitted as a second input signal to the VCO 103. The output signal of the VCO 103 passes through the frequency divider 112 sending the frequency divided version of the output signal is the VCO 103 as a second input signal to the PFD 109. The VCO 103, frequency divider 112, PFD 109 and LPF 111 form a phase locked loop (PLL), which assists the CDR loop 107 and tunes the VCO's 103 center frequency coarsely while the PD 101 tunes the VCO 103 finely.

Figure 1B:
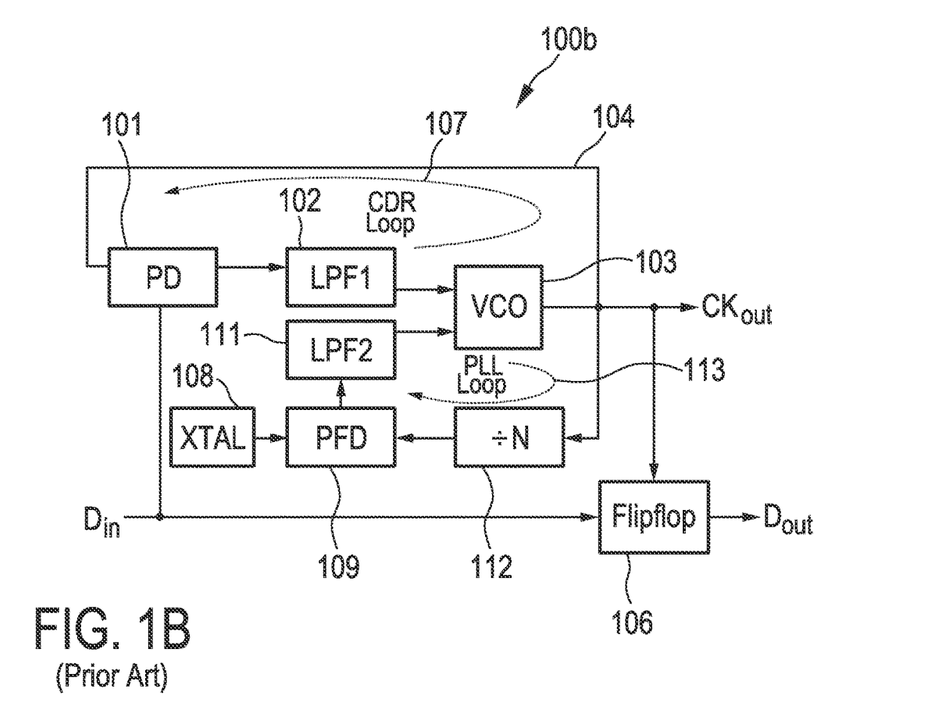
FIG. 1B another generic block diagram of a conventional CDR circuit.

The CDR circuit 100b illustrated in FIG. 1B works well for NRZ signals. However, when the number N of modulation levels of a pulse amplitude modulation signal (PAM) (PAM-N, N≥4) increases, the performance required by the PD becomes challenging. A PAM signal with N modulation levels is designated with the acronym PAM-N.

Figure 2A:
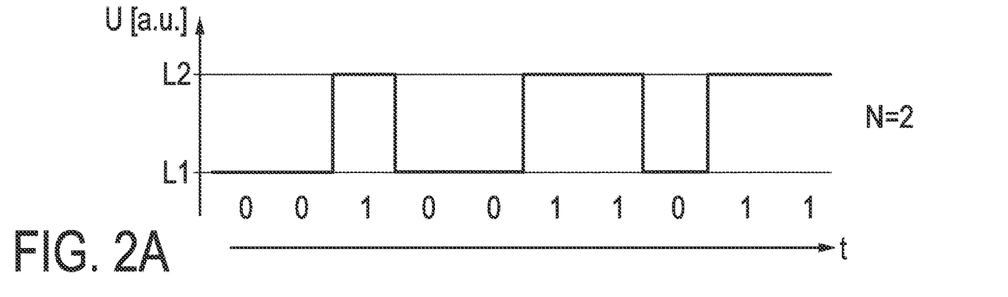
FIGS. 2A, 2B two examples of PAM signals with N=2 and N=4 modulation levels.
Figure 2B:
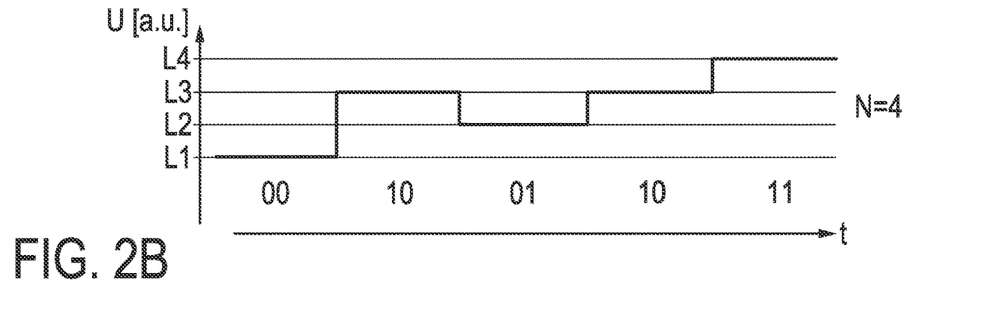

FIGS. 2A and 2B illustrate two examples PAM signals with N=2 and N=4 modulation levels, i.e a PAM-2 and a PAM-4 signal. The two voltage levels L1 and L2 of the PAM-2 signal are associated with two different bits, namely the low voltage level L1 with 0 and the high voltage level L2 with 1. The PAM-2 signal can transmit one bit per clock cycle.

The four voltage levels L1-L4 of the PAM-4 signal are associated with pairs of bits, namely the lowest voltage level L1 with 00, the next voltage level L2 with 01, the next higher voltage level L3 with 10, and the highest voltage level L4 with 11. For this reason, the PAM-4 signal can transmit two bits per clock cycle, which makes PAM-4 modulation very attractive for high-speed data communication networks.

However, the clock and data recovery from PAM-4 signals is challenging compared to the clock and data recovery from PAM-2 signals, which will be explained in the following with reference to FIGS. 3A and 3B.

Figure 3A:
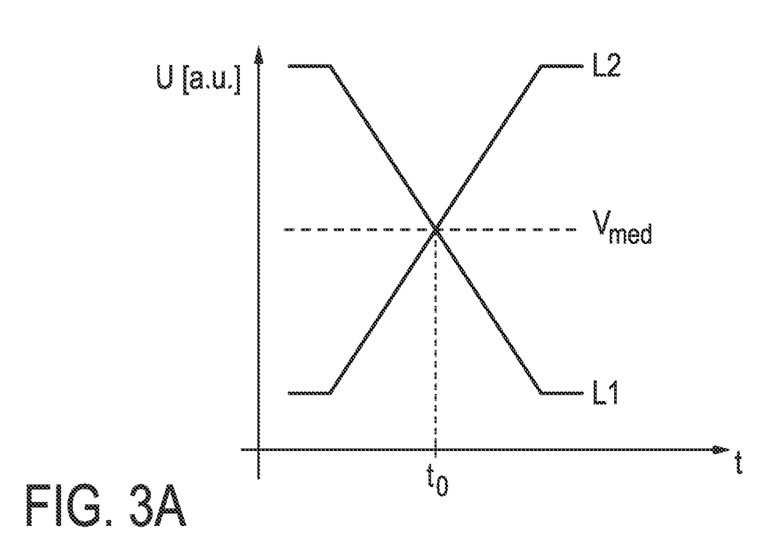
FIG. 3A transitions between voltage levels of a PAM-2 signal.

FIG. 3A shows transitions from voltage level L1 to voltage level L2 and conversely for a PAM-2 signal. The transition edges intersect the medium voltage Vmed between voltage level L1 and L2 at the same point in time t0. The clock signal CKout, for instance its raising edge, is aligned with this point in time t0.

Figure 3B:
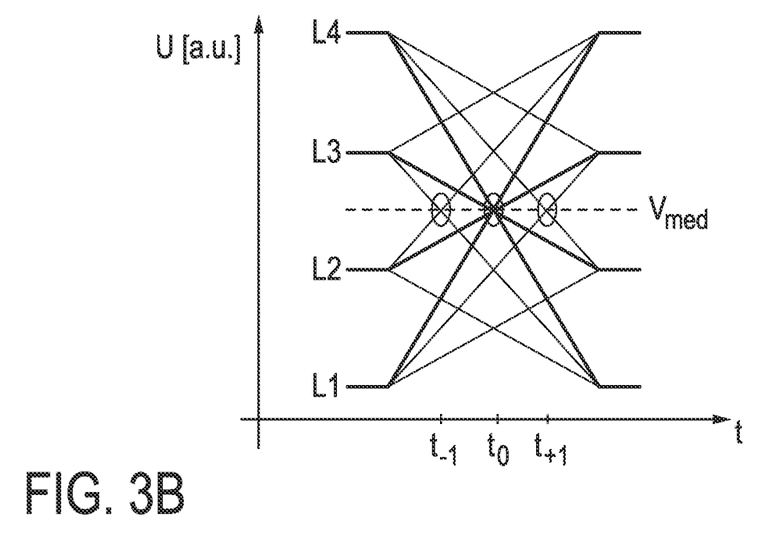
FIG. 3B transitions between voltage levels of a PAM-4 signal.

For a PAM-4 signal the alignment of the clock signal CKout is more complicated because between the four voltage levels there are 12 non-uniform transition edges as it is shown in FIG. 3B. For each one of the four voltage levels L1-L4 there are three possible transitions to a different voltage level. For instance, from voltage level L4 there are three possible transitions to voltage levels L1, L2, and L3.

From voltage level L3 there are also three possible transitions to voltage levels L1, L2, and L4, etc. The transition edges intersect with the medium voltage Vmed at three different points in time which are indicated as t−1, t0, and t+1. The intersections are emphasized with circles in FIG. 3B. If the points in time t−1, t0, and t+1 are used to synchronize the clock signal CKout like in the case of the PAM-2 signal, the clock signal CKout cannot be properly aligned since there is no stable reference point t0 like for a PAM-2 signal and, as a result, a large amount of clock jitter is generated unless appropriate counter measures are taken.

Figure 4:
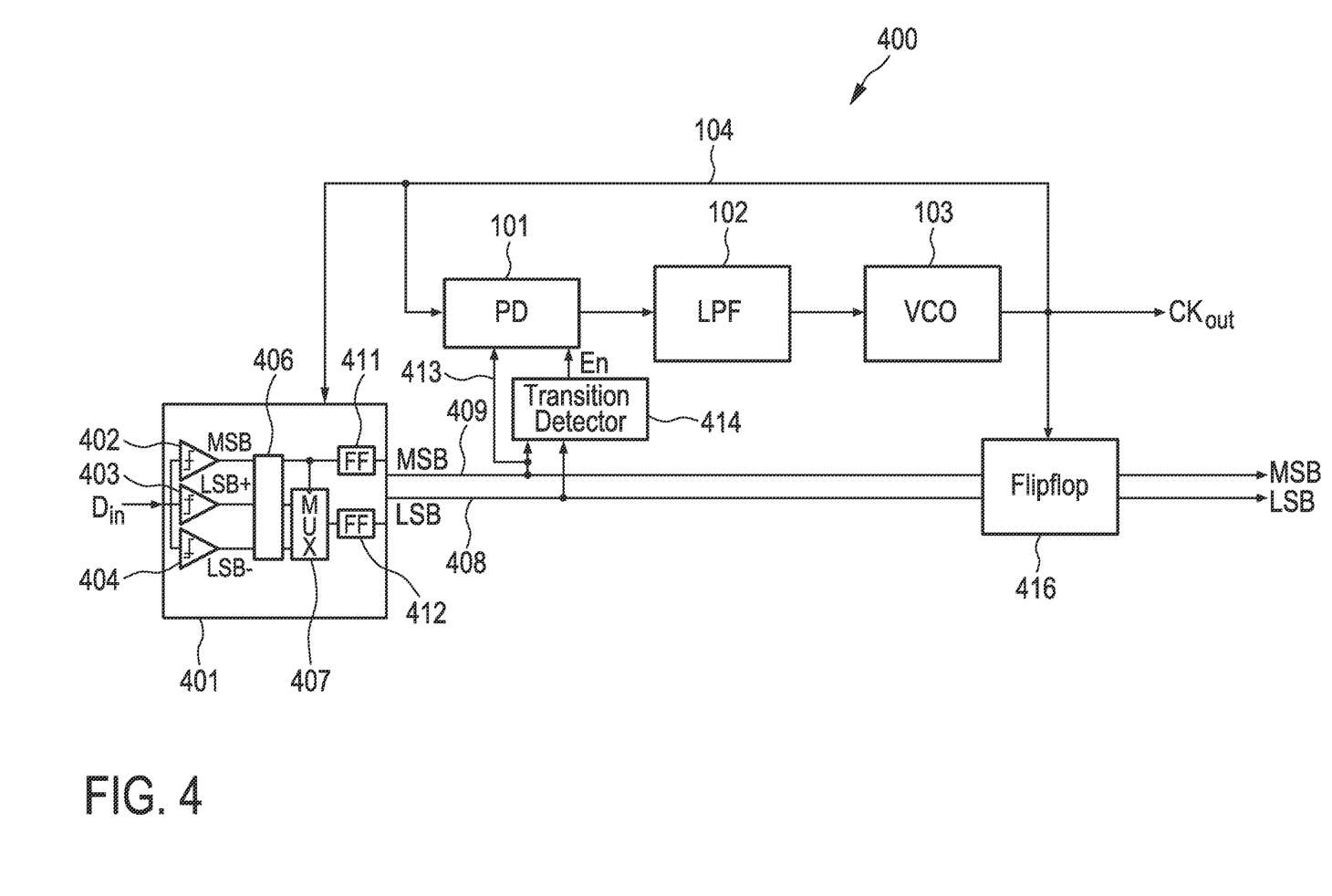
FIG. 4 a CDR circuit for a PAM-4 signal utilizing only symmetrical transitions.

FIG. 4 shows an advanced solution of a circuit 400 for clock and data recovery for PAM-4 signals have been proposed, where only the symmetrical transitions occurring between the topmost and lowest levels or the middle-low and the middle-high ones are used to align the clock signal CKout. To achieve the goal of detecting symmetrical transitions, the CDR circuit 400 detects the transitions after decoding the PAM-4 signal into binary formats. To this end, the PAM-4 signal Din is converted within a converter 401. Specifically, the converter 401 employs three samplers 402-404 including analogue-to-digital converters (ADC). The sampler 402 detects the highest voltage level L4 and outputs the most significant bit (MSB) signal corresponding to the first bit of the bit pairs shown in FIG. 2B. The second bit corresponds to the least significant bit (LSB) with a further modification. If the MSB of a bit pair is 1, then the LSB is denominated upper slice LSB and is labelled LSB+. If the MSB of a bit pair is 0 then the LSB is denominated lower slice LSB is labelled LSB−.

The sampler 403 detects the upper slice LSB+ of the PAM-4 signal, and the sampler 404 detects the lower slice LSB− of the PAM-4 signal. A re-timer stage 406 assures that the output signals MSB, LSB+, and LSB− of the samplers 402-404 remain within a predefined time window. The importance of the timing increases as the data rate of data transmission increases. The detected MSB signal triggers 2:1 multiplexer 407 that functions as a selector switch, which sends the least significant bit LSB to an output line 408. The 2:1 multiplexer 407 selects either the LSB+ signal from sampler 403 if the MSB is 1 or the LSB− signal from sampler 404 if the MSB is 0. The MSB signal is outputted on output line 409. The time matching between the MSB and LSB signals is maintained by appropriately dimensioned delays 411, 412.

The converter works as follows. If the signal Din at a given clock cycle is at voltage level L1, then sampler 402 outputs a 0 which controls the 2:1 multiplexer 407 to output the LSB− signal of sampler 404 corresponding to a bit value 0. If the signal Din at a given clock cycle is at voltage level L2, then sampler 402 outputs a 0 which controls the 2:1 multiplexer 407 to output the LSB− signal of sampler 404 corresponding to a bit value 1. If the signal Din at a given clock cycle is at voltage level L3, then sampler 402 outputs a bit value 1, which controls the 2:1 multiplexer 407 to output the LSB+ signal of sampler 403 corresponding to a bit value 0. If the signal Din at a given clock cycle is at voltage level L4, then sampler 402 outputs a bit value 1, which controls the 2:1 multiplexer 407 to output the LSB+ signal of sampler 403 corresponding to a bit value 1. As a result, the converter outputs a stream of MSB and LSB bits on the output lines 408 and 409. Table 1 summarizes this behaviour.

TABLE 1

| Din | MSB | LSB− | LSB+ |
| --- | --- | --- | --- |
| L1 | 0 | 0 | Not selected |
| L2 | 0 | 1 | Not selected |
| L3 | 1 | Not selected | 0 |
| L4 | 1 | Not selected | 1 |

It is noted that "not selected" means that the multiplexer 407 selects the respective other sampler.

The CDR circuit 400 comprises the CDR loop composed of the phase detector 101, the low-pass filter 102 and the voltage-controlled oscillator 103 that have already been described with reference to FIG. 1A. The MSB signal from output line 409 is provided as input signal to the phase detector 101 via connection 413. The phase detector 101 generates an output signal to align the VCO 103 with the MSB signal provided that PD 101 receives an enable signal En from transition detector 414. The transition detector is configured to output the enable signal only when symmetrical transitions in the input signal Din occur, namely from voltage level L1 to L4 or from L2 to L3 and vice versa. Transition detector 414 determines the symmetrical transition by analysing each two consecutive MSBs and LSBs data information. For instance, in FIG. 2B a symmetrical transition from L2 to L3 occurs once the MSB is switched from 0 to 1 and at the same time LSB is changed from 1 to 0. These symmetrical transitions intersect with medium voltage level Vmed at the same point in time t0 to control VCO 103. Thus, the CDR circuit 400 utilizes transitions from voltage level L1 to voltage level L4 (and also opposite direction from L4 to L1) or from voltage level L2 to voltage level L3 (and also in opposite direction), to control the VCO 103 which generates the clock signal CKout. In this way, jitter of the clock signal CKout is avoided. The clock signal CKout is also provided to converter 401 and to flip-flop 416 to synchronize MSB and LSB output streams.

It should be noted that the architecture presented in FIG. 4, as well as the other known architectures, employs ADCs within the samplers 402-404, which require a clock. The symmetrical transitions are detected after they are processed and delayed by the ADCs. Therefore, a mistuned clock phase can lead to wrong ADC outputs and, consequently, wrong data transitions. This algorithm would become more challenging for higher modulation orders, i.e for N>4.

Consequently, there remains a desire for faster transition detection and clock recovery to accelerate clock acquiring and avoid error propagation through a system.

Figure 5A:
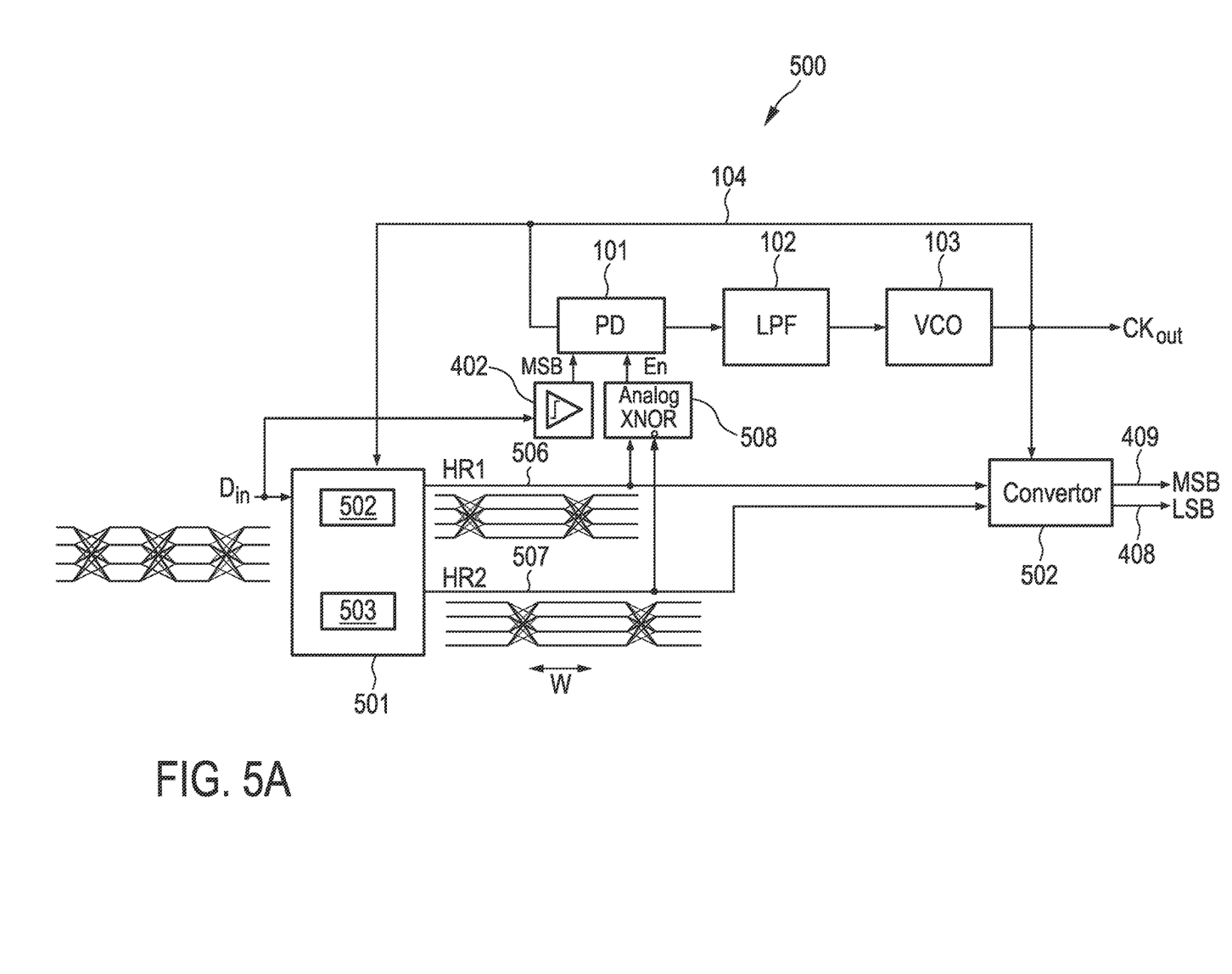
FIG. 5A a CDR circuit for a PAM signal according to the present disclosure.

FIG. 5A shows an embodiment of a proposed clock and the data recovery (CDR) circuit 500. The CDR circuit 500 comprises the CDR loop 107 composed of the phase detector 101, a low pass filter 102, a voltage-controlled oscillator 103 and a feedback loop 104. A PAM-4 input signal Din is provided to a sampler 402 to detect the most significant bit MSB in the input signal and to output the MSB signal to the phase detector 101. The input signal Din is also provided to a time interleave circuit 501 comprising two half-rate track and hold circuits 502, 503. In FIG. 5A all levels L1-L4 of the input signal are shown simultaneously while in reality at each clock cycle only one symbol corresponding to one level is transferred. The half rate track and hold circuits 502, 503 sample at rising and falling edges of the clock signal CKout, respectively, and output half rate signals HR1 and HR2 on lines 506, 507, respectively. The phase of the of signals HR1 and HR2 is away by 180°.

Figure 5B:
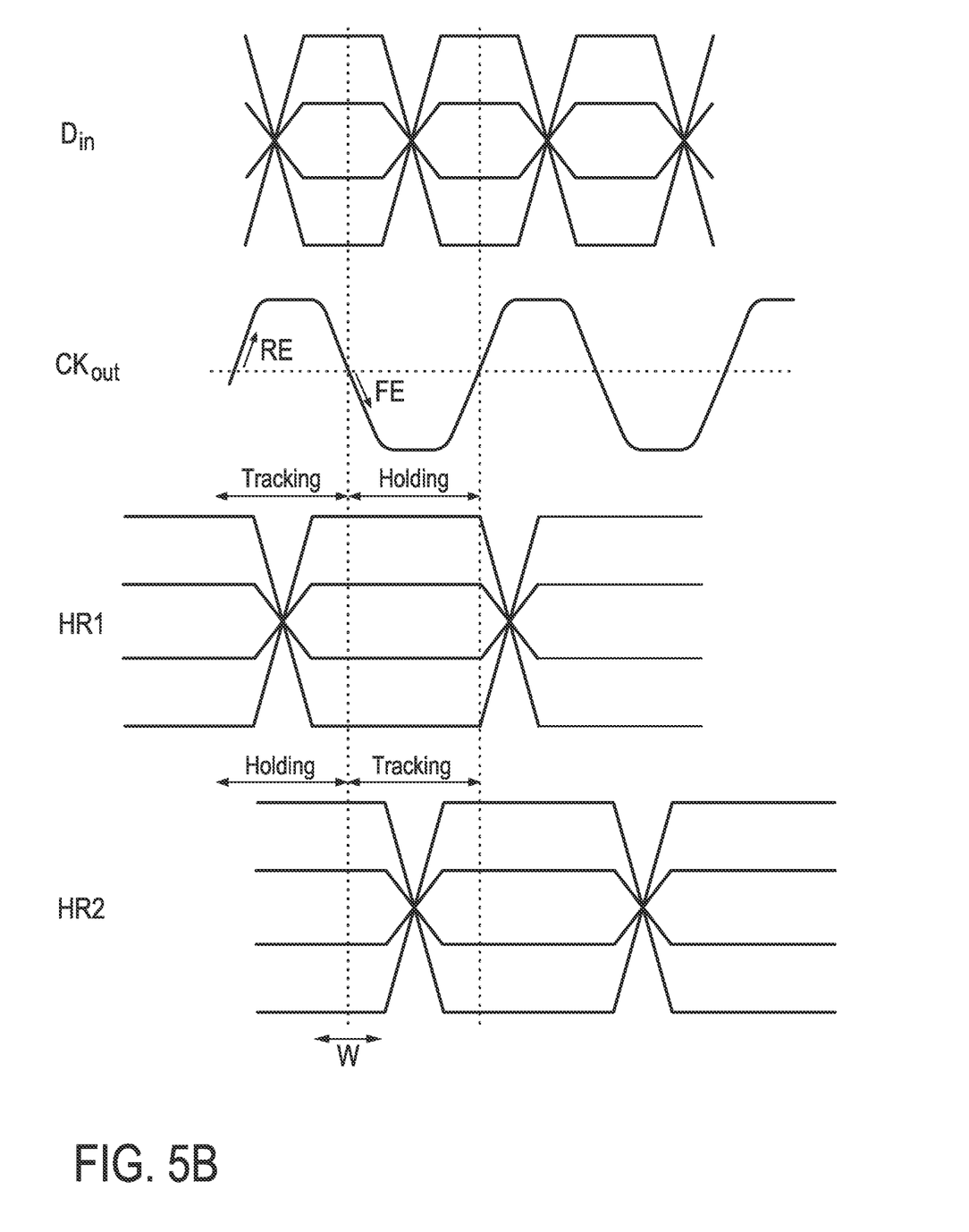
FIG. 5B a timing diagram of signals of the CDR circuit of FIG. 5A.

FIG. 5B shows the timing of the input signal Din, the clock signal CKout and the half rate signals HR1 and HR2. The track and hold circuit 502, samples the data at a rising edge RE of the clock and holds the data during the next half clock cycle until the next rising edge RE of the clock occurs. The track and hold circuits 503, samples the data at a falling edge FE of the clock and holds the data during the next half clock cycle until the next falling edge FE of the clock occurs. Thus, it can be concluded that each track and hold circuit samples every output of 2-bit information of the PAM-4 input signal either on rising or falling edges of the clock and holds it for the next half cycle of the clock signal CKout. Specifically, a rising edge RE of a clock pulse triggers the track and hold circuit 502 which holds the signal Din for a half clock cycle until a next rising edge RE of the next clock pulse is detected. The falling edge FE of clock pulse triggers the track and hold circuit 503 which holds the signal Din for a half clock cycle until the next falling FE edge of the next clock pulse is detected. The same reasoning applies if the track and hold circuits are interchanged. In other words, the high-speed PAM-4 input signal Din is converted into two separate PAM-4 signals HR1, HR2 having only have half of the bit rate of the input signal Din.

FIG. 5A displays a time window W. A stored level of input signal Din is outputted as half rate signal HR1 from the beginning to the end of time Window W. During the time window W, a consecutive level of the input signal Din is outputted as half rate signal HR2 by track and hold circuit 503. A corresponding situation is displayed in FIG. 5B. A stored level of input signal Din is outputted as half rate signal HR2 from the beginning to the end of time Window W. During the time window W, a consecutive level of the input signal Din is outputted as half rate signal HR1 by track and hold circuit 502. Thus, during time window W two consecutive symbols carrying two bit pairs of the input signal Din contained in the half rate signals HR1, HR2, are overlapping in the time domain.

The half rate signal HR1 is a supplied to an input of an analogue XNOR gate 508, while at the same time the half rate signal HR2 is supplied to an inverted input of the XNOR gate 508. By computing an analogue XNOR function between the two interleaved output signals HR1 and HR2, symmetrical transitions between the voltage levels L1-L4 can be evaluated as shown in Table 2. In lines 3, 5, 8, and 10 of Table 2 the symmetrical transitions are highlighted. The transition edges for all these transitions intersect with the medium voltage Vmed at the point in time t0. Hence, VCO 103 is properly controlled and no jitter in the clock signal CKout is generated.

TABLE 2

| # | HR1 | HR2 | Inverted HR2 | XNOR |
|---|-----|-----|--------------|------|
| 1 | L4 | L3 | L2 | 0 |
| 2 | L4 | L2 | L3 | 0 |
| 3 | L4 | L1 | L4 | 1 |
| 4 | L3 | L4 | L1 | 0 |
| 5 | L3 | L2 | L3 | 1 |
| 6 | L3 | L1 | L4 | 0 |
| 7 | L2 | L4 | L1 | 0 |
| 8 | L2 | L3 | L2 | 1 |
| 9 | L2 | L1 | L4 | 0 |
| 10 | L1 | L4 | L1 | 1 |
| 11 | L1 | L3 | L2 | 0 |
| 12 | L1 | L2 | L3 | 0 |

The output signal of the analogue XNOR gate is used as an enable signal for the phase detector 101. Consequently, only symmetrical transitions are used to align the clock signal CKout.

Figure 5C:
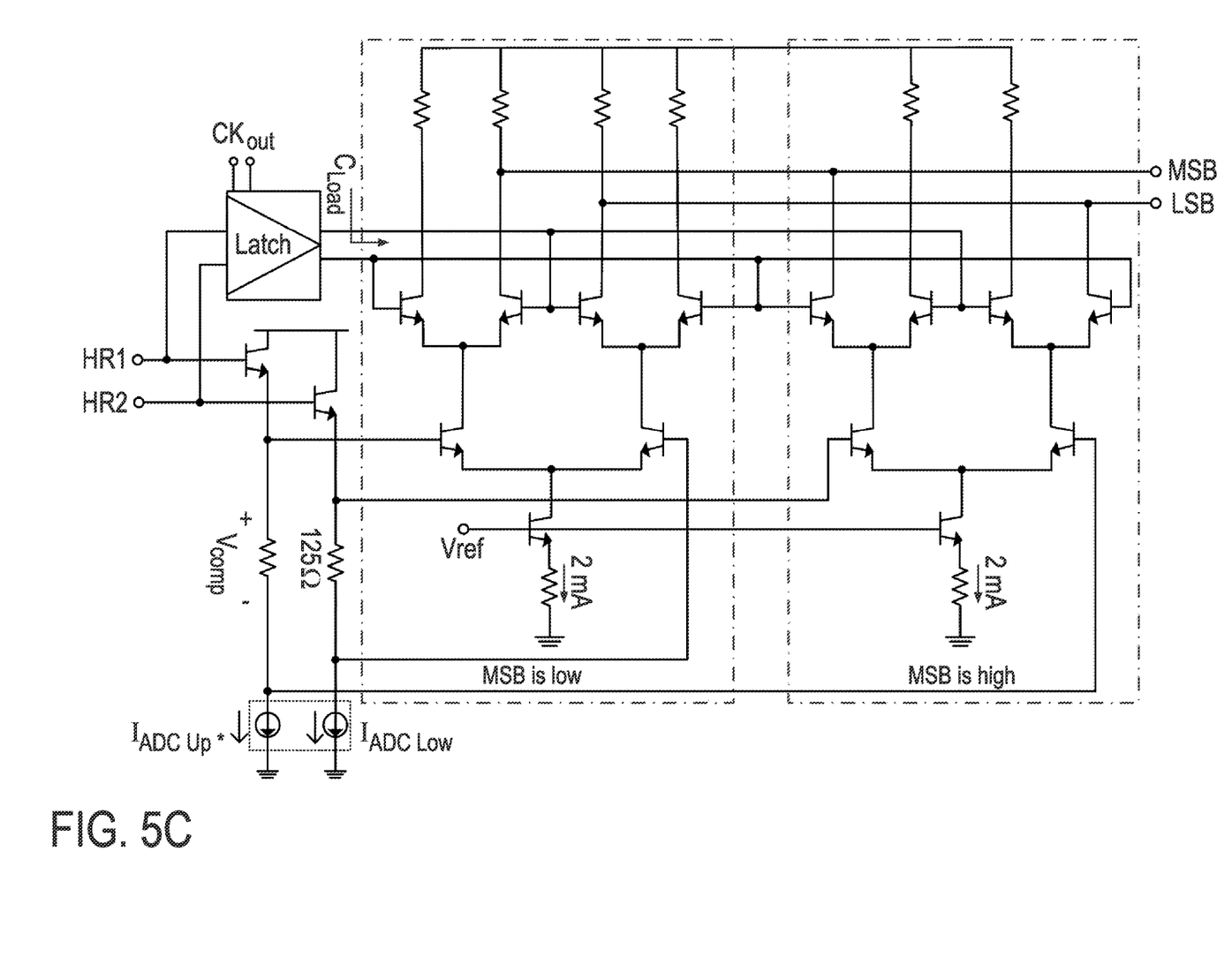
FIG. 5C a schematic block diagram of the converter included in the CDR circuit shown in FIG. 5A.

The half rate signals HR1 and HR2 are provided as input signals to a converter 502 that generates an MSB and an LSB bit stream as output signals on lines 503, 504. FIG. 5C displays an implementation of converter 502 in detail. The currents $I_{ADC\ Up}$ and $I_{ADC\ Low}$ set the threshold levels for upper and lower levels of the PAM-4 signal. The shown design of converter 502 has been published by A. Malignaggi et al. [1]. However, the specific design of converter 502 is not part of the present disclosure in the sense that any other converter design could be used as well that converts the half rate signals HR1 and HR2 an MSB and an LSB bit stream.

Figure 5D:
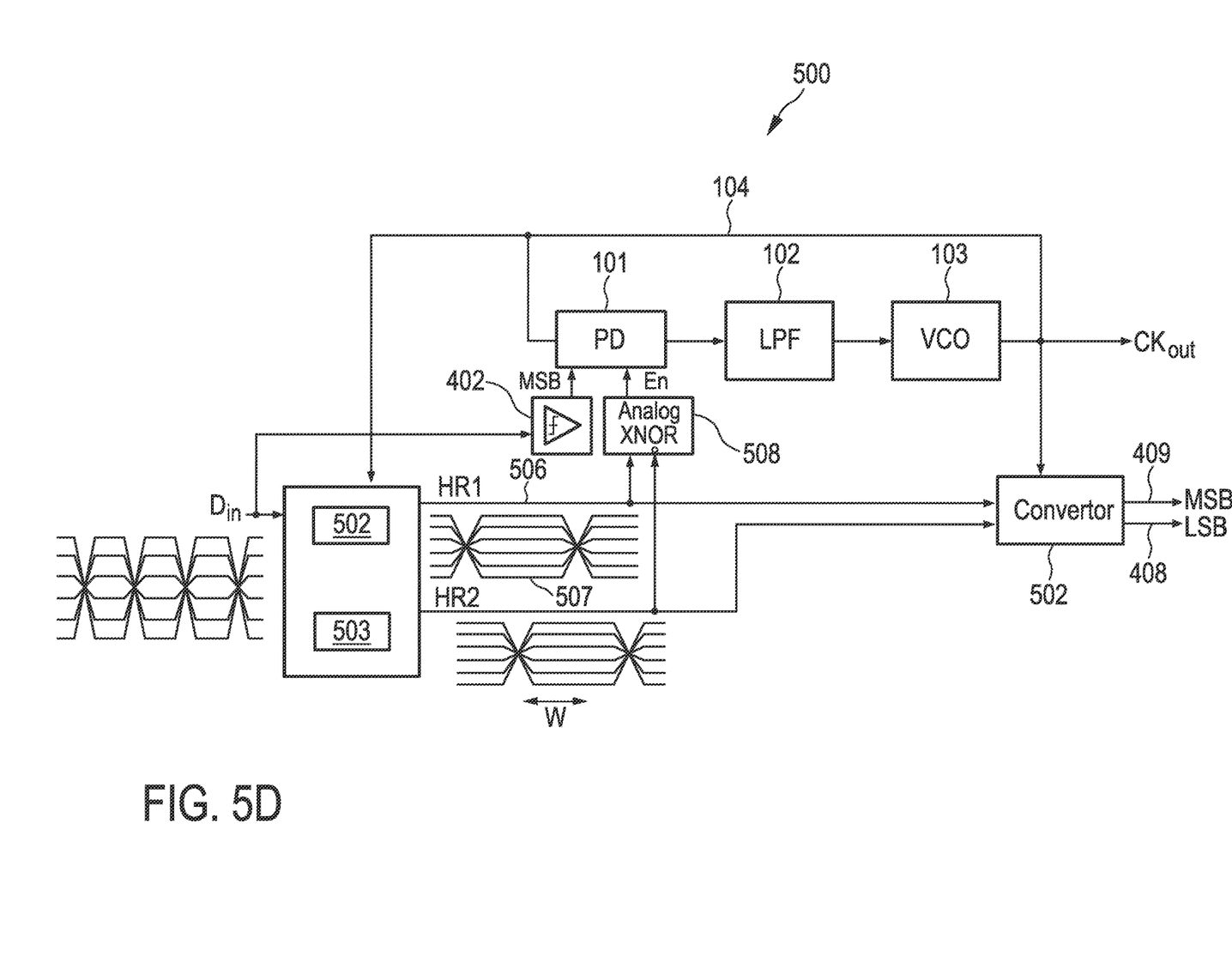
FIG. 5D the CDR circuit shown in FIG. 5A illustrating the functioning with a PAM-6 signal as input signal.

FIG. 5D shows the CDR circuit 500 of FIG. 5A when it receives a PAM-6 signal as input signal Din having six different levels L1-L6. Like for a PAM-4 signal described in connection with FIG. 5A, the input signal is converted into two half rate signals HR1 and HR2 to determine symmetrical transitions for synchronizing the clock signal CKout. For the sake of clarity, not all possible transitions between the levels L1-L6 are indicated in FIG. 5C. The working principle of the CDR circuit remains the same even for PAM-8 (three bits of information) signals or PAM-N signals with N>8.

Figure 6:
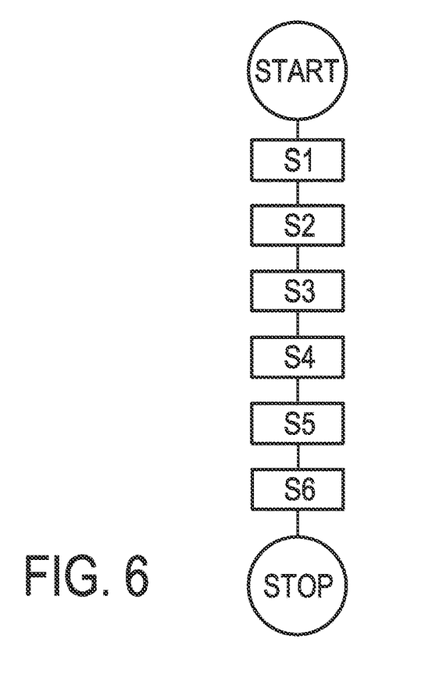
FIG. 6 a schematic flow diagram of the method according to the present disclosure.

FIG. 6 shows a flow diagram of a method for recovering clock and data signals from a multilevel pulse amplitude modulated signal transferring two bits per symbol at a first symbol rate. In step S1 the multilevel pulse amplitude modulated signal is received as input signal Din. In step S2 an MSB signal is extracted from the input signal Din. In step S3 the MSB signal is provided to a phase detector 101 included in a clock and data recovery loop 107. In step S4 two output signals HR1, HR2 having a second symbol rate, which is smaller than half of the first symbol rate of the input signal Din, are generated from the input signal Din. In step S5 the output signals HR1, HR2 are received at a logical gate 508 generating an enable signal En for the phase detector 101 indicating symmetrical transitions in the input signal. Finally, in step S6 the output signals HR1, HR2 from the interleave circuit 501 are converted into an MSB and an LSB bit stream. Even though the steps are described in a sequential order, they rather take place in parallel.

The early evaluation of symmetrical transitions helps the CDR loop 107 to lock faster. Furthermore, the bit error rate of the CDR circuit 500 is improved and reduces the detection error probability due to a wrong clock phase. Another advantage of the CDR circuit 500 is that its complexity does not increase with an increasing number of levels N of a PAM-N signal.

Individual components or functionalities of the present invention are described in the embodiment examples as software or hardware solutions. However, this does not mean that a functionality described as a software solution cannot also be implemented in hardware and vice versa. Similarly, mixed solutions are also conceivable for a person skilled in the art, in which components and functionalities are simultaneously partially realized in software and hardware.

In the claims, the word "comprising" does not exclude other elements or steps, and the indefinite article "a" does not exclude a plurality.

A single unit or device may perform the functions of multiple elements recited in the claims. The fact that individual functions and elements are recited in different dependent claims does not mean that a combination of those functions and elements could not advantageously be used.

Non-Patent Literature

[1] A. Fatemi, G. Kahmen and A. Malignaggi, "A 96-Gb/s PAM-4 Receiver Using Time-Interleaved Converters in 130-nm SiGe BiCMOS," in *IEEE Solid-State Circuits Letters*, vol. 4, pp. 60-63, 2021, 10.1109/LSSC.2021.3059254.

What is claimed is:

1. An apparatus for recovering clock and data signals from a multilevel pulse amplitude modulated signal received as an input signal by the apparatus, wherein the input signal has a first symbol rate and transfers two bits per symbol, wherein the apparatus comprises a phase detector, a low-pass filter, a voltage-controlled oscillator, and a feedback loop forming a clock and data recovery (CDR) loop, wherein the voltage-controlled oscillator outputs a recovered clock signal that is provided as a first input signal to the phase detector, characterized in that the apparatus comprises:

a sampler configured to extract a most significant bit (MSB) signal from the input signal, wherein the output of the sampler is connected with an input of the phase detector to provide the MSB signal as a second input to the phase detector;

an interleave circuit configured to receive the input signal and the recovered clock signal from the voltage-controlled oscillator and to generate two output signals having a second symbol rate which is half of the first symbol rate of the input signal;

a logical gate configured to receive the two output signals from the interleave circuit and to generate an enable signal for the phase detector indicating symmetrical transitions in the input signal; and a converter configured to receive the recovered clock signal from the voltage-controlled oscillator and to convert the two output signals from the interleave circuit into an MSB and a least significant bit (LSB) bit stream.

2. The apparatus according to claim 1, wherein the two output signals of the interleave circuit are phase-shifted by 180°.

3. The apparatus according to claim 2, wherein during a time window, two consecutive symbols of the input signal contained in the two output signals of the interleave circuit are overlapping in the time domain.

4. The apparatus according to claim 1, wherein the logical gate is an XNOR gate.

5. The apparatus according to claim 1, wherein the interleave circuit comprises two track and hold circuits.

6. The apparatus according to claim 1, wherein one of the two output signals is provided to an input of the XNOR gate at a same time as another of the two output signals is provided to an inverted input of the XNOR gate.

7. A method for recovering clock and data signals from a multilevel pulse amplitude modulated signal transferring two bits per symbol at a first symbol rate, comprising:

receiving, by a sampler, the multilevel pulse amplitude modulated signal as an input signal;

extracting, by the sampler, a most significant bit (MSB) signal from the input signal;

receiving, by a phase detector included in a clock and data recovery (CDR) loop, the MSB signal;

generating, by a voltage-controlled oscillator of the CDR loop, a recovered clock signal transmitted to the phase detector, a converter, and an interleave circuit;

generating, by the interleave circuit, two output signals from the input signal, wherein the two output signals have a second symbol rate which is half of the first symbol rate of the input signal;

receiving, by a logical gate, the two output signals, wherein the logical gate generates an enable signal for the phase detector indicating symmetrical transitions in the input signal based on the two output signals; and converting, by the converter, the two output signals from the interleave circuit into an MSB and a least significant bit (LSB) bit stream.

8. The method according to claim 7, further comprising phase shifting the output signals by 180°.

9. The method according to claim 8, further comprising during a time window, overlapping in the time domain, two consecutive symbols of the input signal contained in the two output signals of the interleave circuit.

10. The method according to claim 7, further comprising providing an XNOR gate as the logical gate.

11. The method according to claim 10, further comprising providing one of the two output signals to an input of the XNOR gate at a same time as providing another of the two output signals to an inverted input of the XNOR gate.

12. The method according to claim 7, further comprising providing the interleave circuit with two track and hold circuits.

* * * * *